United States Patent [19]
Gay et al.

[11] Patent Number: 5,394,029
[45] Date of Patent: Feb. 28, 1995

[54] GEOMAGNETIC ORIENTATION SENSOR, MEANS, AND SYSTEM

[76] Inventors: John C. Gay, 232 Galispi Rd., Monroe, La. 71202; Billy R. Smith, 1713 Filhoil, Apt. B, Monroe, La. 71203

[21] Appl. No.: 18,872
[22] Filed: Feb. 17, 1993
[51] Int. Cl.⁶ .................. G01C 21/00; H03K 17/90
[52] U.S. Cl. .................. 327/511; 364/449; 364/559; 33/361
[58] Field of Search ............ 307/309; 364/449, 453, 364/454, 559; 33/361, 356; 73/178 R

[56] References Cited

U.S. PATENT DOCUMENTS

| | | | |
|---|---|---|---|
| 4,085,440 | 4/1978 | Hose | 73/178 R |
| 4,300,390 | 11/1981 | Shimizu | 33/361 |
| 4,429,469 | 2/1984 | Tsushima et al. | 364/559 |
| 4,497,034 | 1/1985 | Kuno et al. | 33/361 |
| 4,660,161 | 4/1987 | Okada | 364/571.04 |
| 5,040,122 | 8/1991 | Neukirchner et al. | 364/454 |
| 5,287,628 | 2/1994 | Yamaguchi et al. | 364/559 |

Primary Examiner—Timothy P. Callahan
Assistant Examiner—Toan Tran
Attorney, Agent, or Firm—Lester N. Arnold

[57] ABSTRACT

The Geomagnetic Orientation Sensor is a device used to determine the orientation of objects with respect to the magnetic field surrounding the earth. The sensor may also be used to determine orientation with respect to a local magnetic field, a local attenuation of the earth's magnetic field, or used as a pointer to track moving magnetic potentials. The device incorporates three mutually orthogonal Hall effect generator pairs, the output voltage differentials of which are directly proportional to the magnetic field intensity and direction relative to each generator pair. A set of three differential amplifier circuits detect and amplify the small voltages induced by the geomagnetic field. The resulting voltages, $V_X$, $V_Y$, and $V_Z$, are multiplied by a constant to acquire three orthogonal angular displacement values with a range of 0 degrees to 180 degrees. The device is further arranged with an analog to digital converter for subsequent analysis of the three indicative voltages by a digital computer, and a computer program that performs the necessary calculations to convert the 180 degree maximum angular displacement values to pitch, roll, and yaw numbers with a maximum value of 360 degrees. A second computer program performs the various calculations necessary to describe and display the orientation of remote objects on a computer display. The preceding embodiment may be referred to as a computer input device.

15 Claims, 5 Drawing Sheets

ANGULAR DISPLACEMENT
EQ. 2, SENSITIVITY CONSTANT  $K = 180°/V_{0MAX} - V_{0MIN}$

GEOMAGNETIC ORIENTATION SENSOR, MEANS, AND SYSTEM

BACKGROUND—FIELD OF THE INVENTION

This invention relates to object orientation and tracking systems, and more specifically to object orientation systems that use magnetic fields and Hall generators to determine angular displacement values.

BACKGROUND—DESCRIPTION OF THE PRIOR ART

The use of magnetic fields for determining object orientation is well known. For example, U.S. Pat. No. 3,983,474, Kuipers, 1976, describes a means and system for determining object orientation using mutually orthogonal coils and a nutating magnetic field.

Although useful as a computer input device in the field of virtual reality, the device is fairly limited to a small sphere of operation near the source of the nutating magnetic field. Another disadvantage attributable to devices of this complexity is the cost and difficulty of their production.

The use of Hall generators for determining object orientation, in conjunction with magnetic fields, is also well known. For example, U.S. Pat. No. 3,824,455, Levitt, 1974, describes a device for providing pitch, roll, and yaw sinusoidal signals utilizing two mutually orthogonal Hall generator plates.

This patent demonstrates the superiority of Hall effect generators over inductive coils as the sensing elements of a magnetic orientation apparatus. However, it does not conform to the size and weight requirements of such virtual reality applications as head mounted displays. Another disadvantage to mechanical devices of such complexity is that they are relatively expensive, noisy, and difficult to produce.

OBJECTS AND ADVANTAGES

What has been needed, particularly in the field of virtual reality, is a more direct and simplified means of determining the orientation of remote objects. Such is the advantage of the solid state sensor described herein. Other objects and advantages of the present invention are:

(a) To provide constant availability of three voltage analogs representing pitch, row, and yaw, such that a computer, connected to a high speed digitizer, does not have to wait for signals to arrive in sequence.

(b) To provide a semiconductor orientation device that can be miniaturized, far smaller than coils of wire or gyroscopes.

(c) To provide an orientation sensor that has the mobility of a gyroscope without any moving mechanical parts.

(d) To provide an orientation sensor that can be produced faster, and more economically, through the use of low cost semiconductor Hall elements.

(e) To reduce the concern over possible health risks associated with electromagnetic fields.

(f) To reduce damage to magnetic computer storage mediums that may occur with the use of strong alternating magnetic fields.

BRIEF DESCRIPTION OF THE INVENTION

The aforementioned advantages and unique construction of the present invention shall be better understood by referencing to the accompanying drawings such that:

DESCRIPTION OF THE INVENTION

Prior to describing the preferred embodiments of the present invention, a second capability of Hall generators will be discussed in addition to the basic effect described in cited U.S. Pat. No. 3,824,455, Levitt, 1974. It is known that if both the control current, $I_c$, and the magnetic field density, H, are held constant, the Hall voltage, $V_H$, becomes a direct function of the angle between the magnetic field and the plane of the Hall generator.

Figure 1:
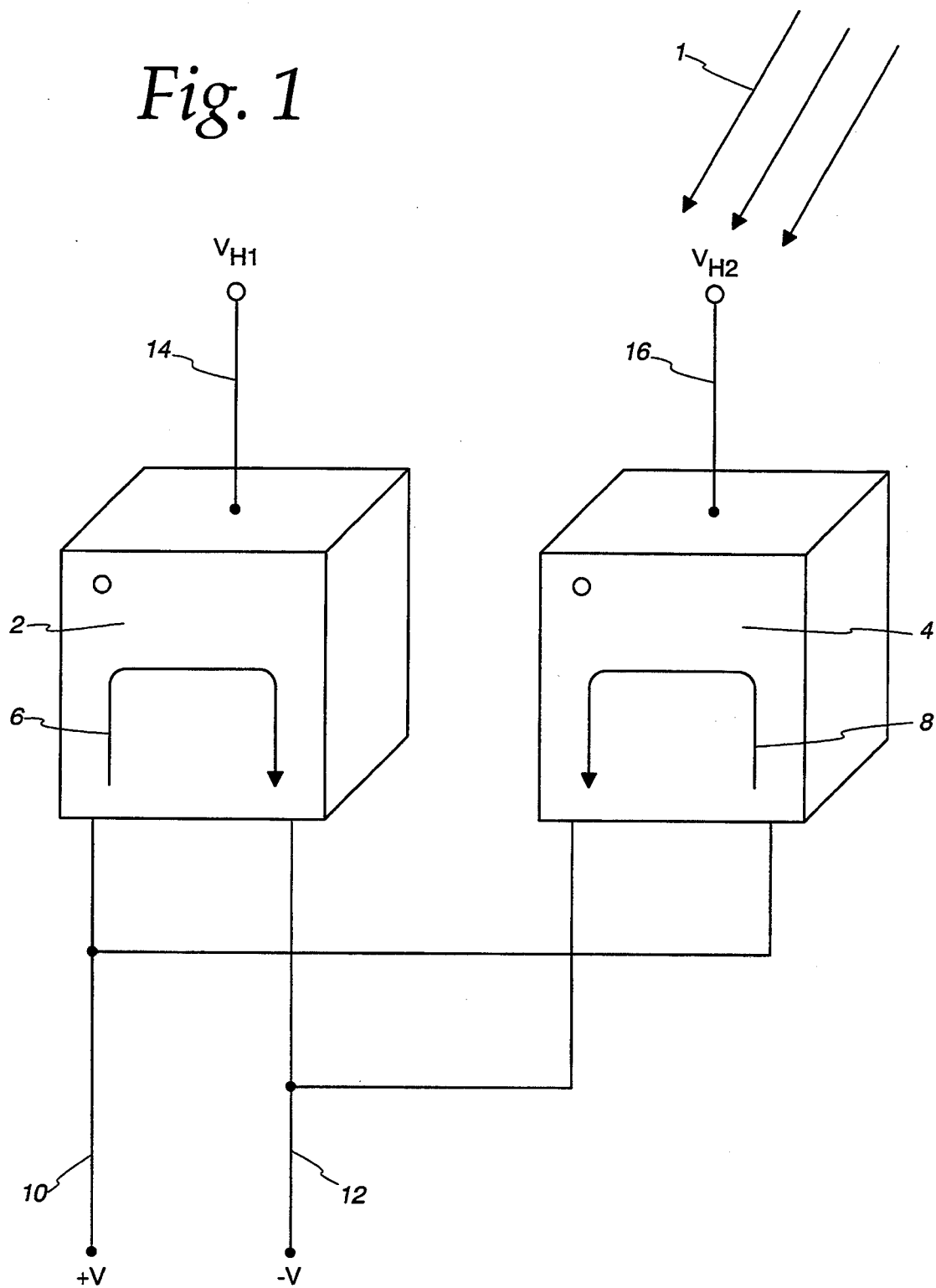
FIG. 1 shows a schematic representation of a known method for detecting the geomagnetic field with two Hall generator elements so disposed that their respective control currents flow in opposite directions.
Figure 2:
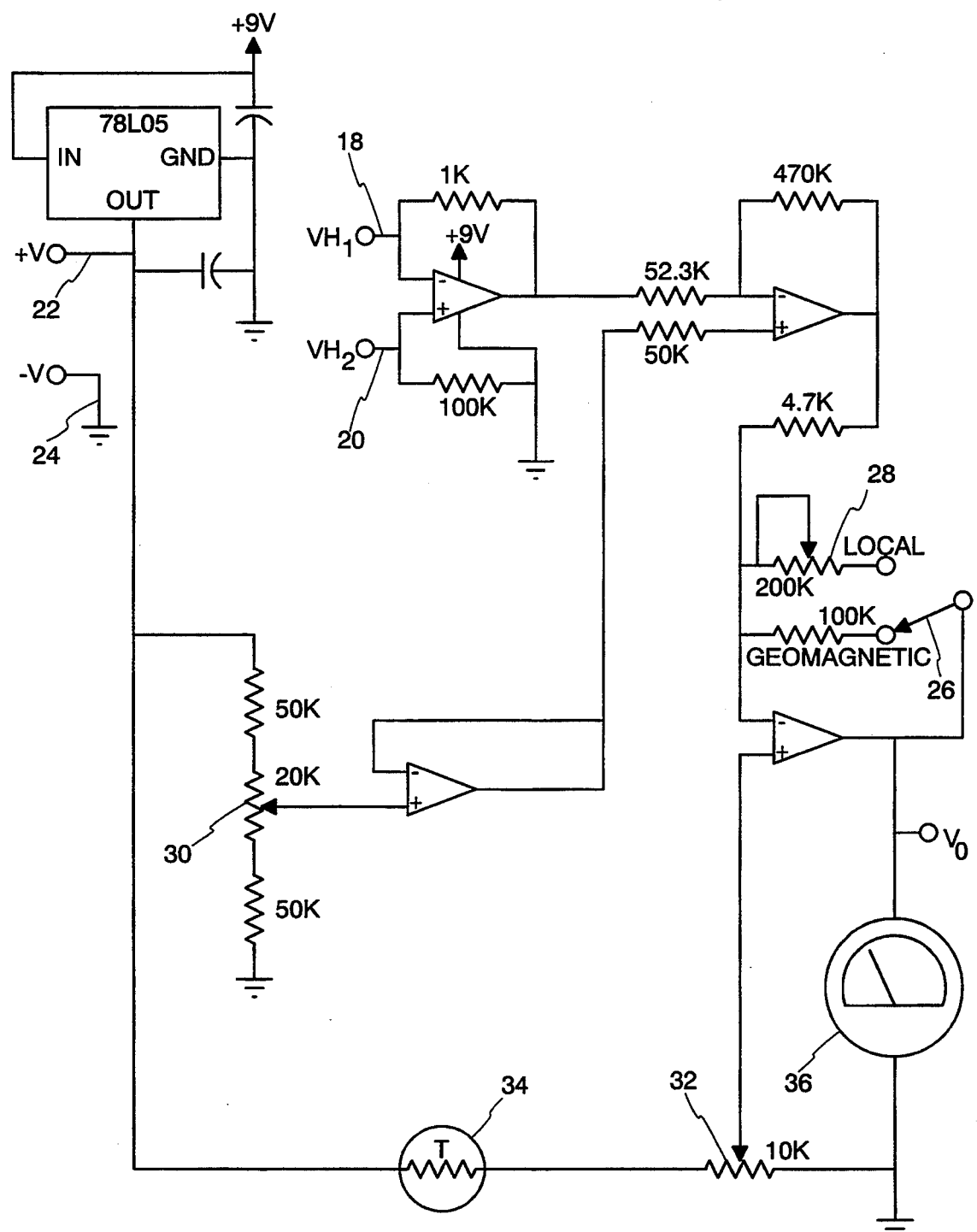
FIG. 2 shows a schematic diagram of an electronic differential amplifier circuit that may be used to measure the Hall voltage, so developed across a pair of Hall generators, by the geomagnetic field.

Referring to FIG. 1, a method of detecting a geomagnetic field 1, represented by a set of arrows, through the use of affordable semiconductor type Hall effect generators is shown; wherein, two Hall generators 2 and 4 are so disposed that their respective control currents 6 and 8 flow in opposite directions through two circuit loops provided by electrical connections 10 and 12. The resulting Hall voltages $V_{H1}$ and $V_{2H}$ provided by electrical connections 14 and 16, vary inversely with respect to each other to give a voltage differential. This effectively doubles the sensitivity of a single Hall generator element. The Hall voltage differential developed by geomagnetic field 1 may be measured by the D.C. electronic amplifier circuit shown in FIG. 2; wherein conductive paths 18, 20, 22, and 24 of FIG. 2 are electrically connected to 14, 16, 10, and 12 of FIG. 1, respectively.

A field select switch 26 allows the circuit to detect the geomagnetic field or a local magnetic field. A gain adjustment potentiometer 28 controls the sensitivity of the amplifier when field select switch 2e is set to the local field position. Two off-set adjustment potentiometers 30 and 32 control the sensitivity of the amplifier when the field select switch is in the geomagnetic field position. Output voltage drift due to the thermoelectric effect is compensated by a temperature compensation thermistor 34.

This circuit constitutes a two dimensional electronic compass; wherein, a maximum output voltage $V_o$ measured by a voltmeter 36 indicates that the plane of the Hall generator pair is at 90 degrees normal to the direction of the geomagnetic flux (magnetic North). However, as will be shown, three orthogonal pairs of Hall generator elements constitute a unique device, a geomagnetic orientation sensor that can determine X, Y, and Z angular displacement values.

Figure 3:
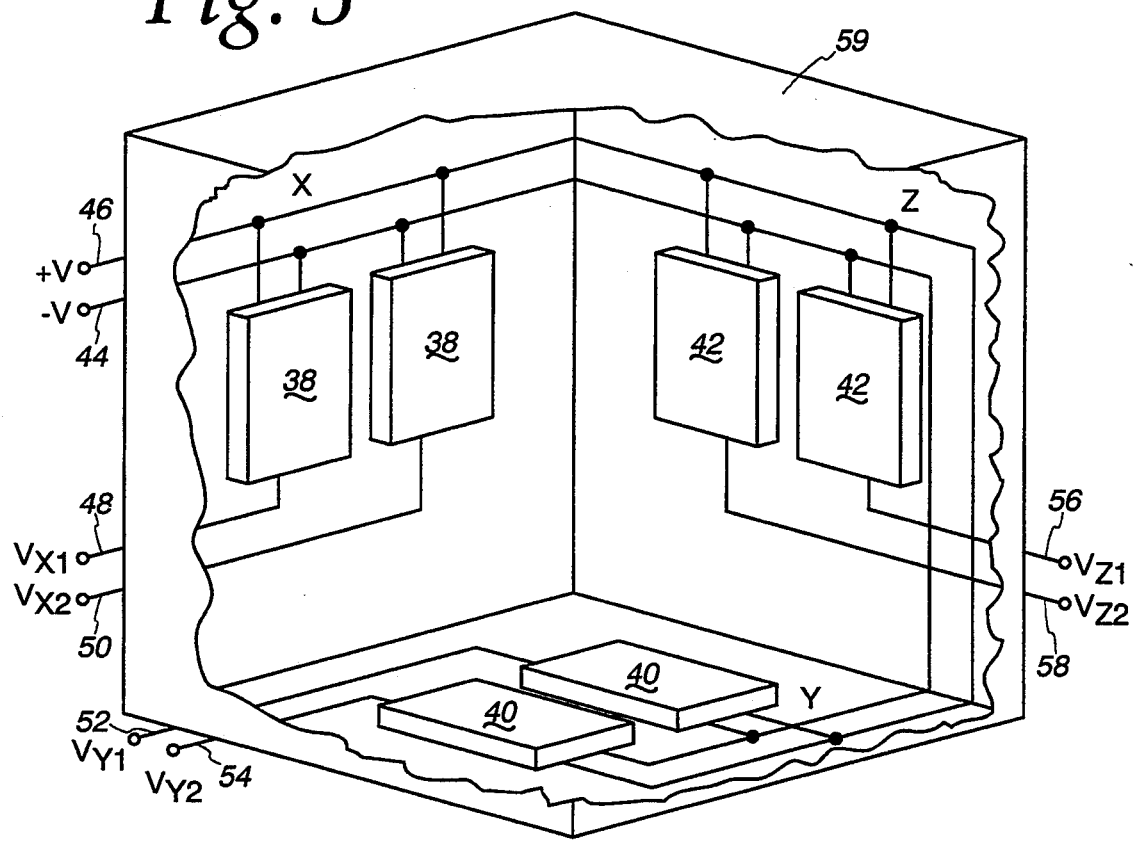
FIG. 3 is an illustration of the internal construction of the present invention.

Referring to FIG. 3, an illustration of the present invention is shown. The geomagnetic orientation sensor comprises three mutually orthogonal Hall sensor planes: an X plane, Y plane, and a Z plane. Each of the sensor planes is comprised of a Hall generator pair 38, 40, and 42, for detecting the geomagnetic field. Electrical control currents are provided to each Hall element by means of conductive paths 44 and 46, such that two control currents flow in opposite directions through each pair of Hall elements (38, 40, and 42). Furthermore, a set of connectors, reference numerals 48, 50, 52, 54, 56, and 58 are also provided for the Hall voltage outputs of each of the Hall generators: $V_{X1}$, $V_{X2}$, $V_{Y1}$, $V_{Y2}$, $V_{Z1}$, $V_{Z2}$. The entire sensor apparatus is provided with a protective enclosure 59 made of epoxy (here shown in a cut away view).

Figure 5:
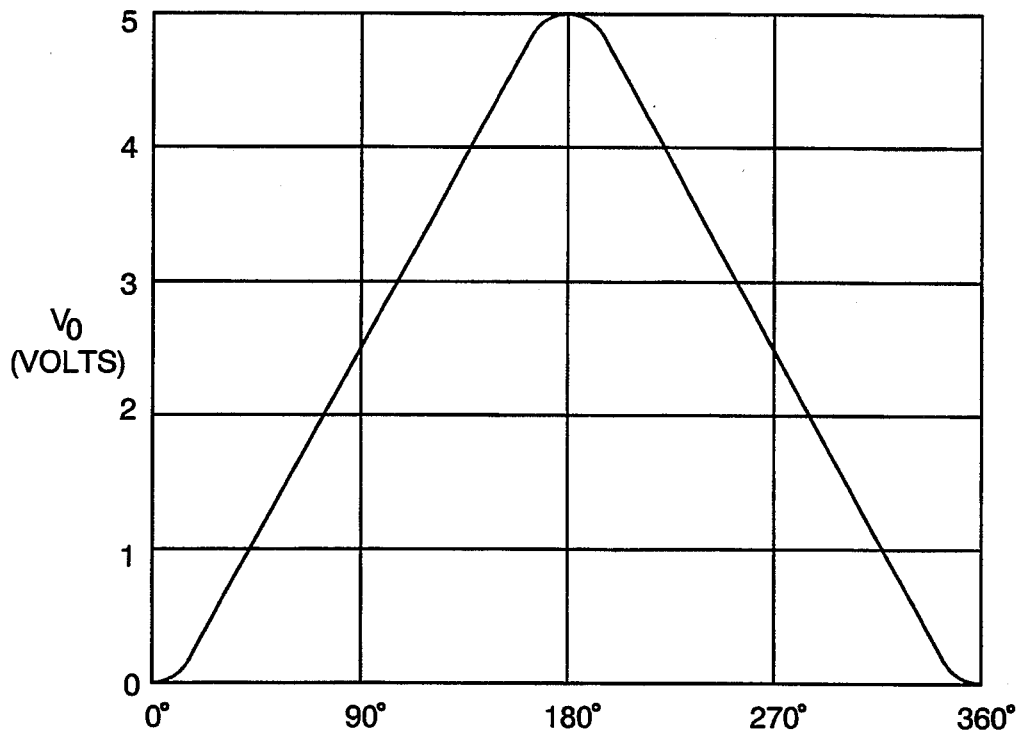
FIG. 5 illustrates graphically the relationship between the output voltage of one differential amplifier and the angle of the geomagnetic flux normal to one sensor plane.
Figure 8:
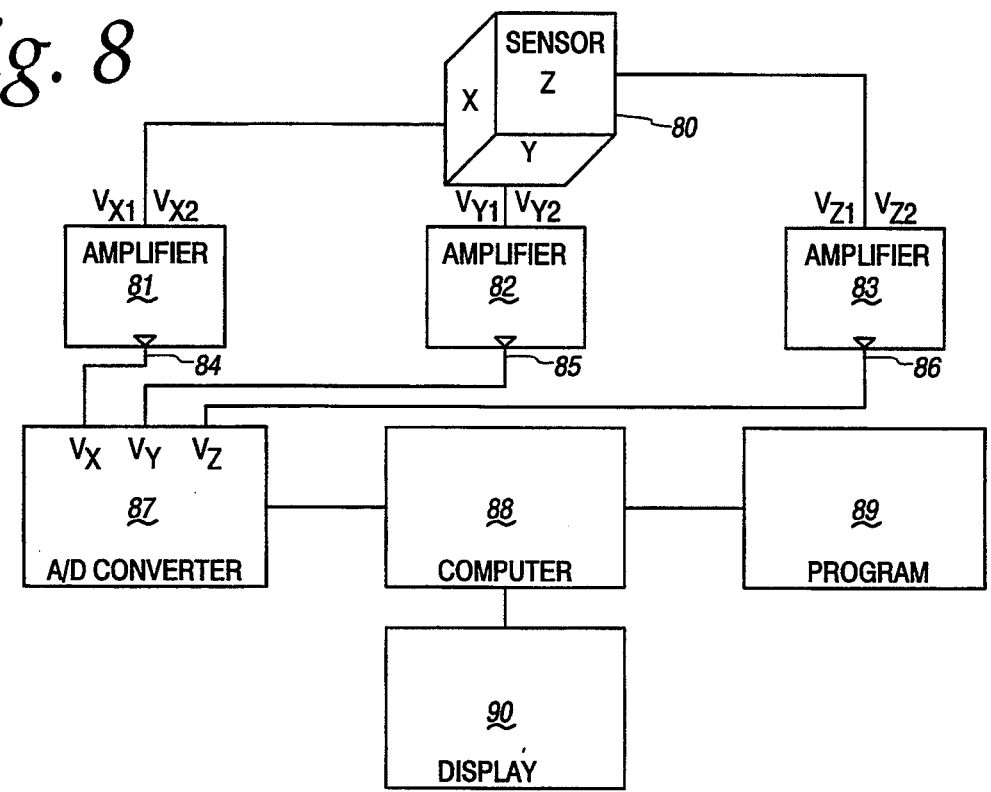
FIG. 8 shows a block diagram of a means for controlling computer graphics through the use of a geomagnetic orientation sensor as a computer input device.

In a typical embodiment, FIG. 8, each of the X, Y, and Z sensor planes of a geomagnetic sensor 80 is connected to a set of three differential amplifiers 81, 82, and 83. Each of these amplifiers is identical in construction to the schematic diagram of FIG. 2. Referring again to FIG. 8, the voltage differentials from each of the X, Y, and Z sensor planes is modified by differential amplifiers 81, 82, and 83, to give three output voltages with a maximum range of five volts for a continuous range of angles between 0 and 180 degrees (see FIG. 5). A set of three resultant voltage outputs $V_X$, $V_Y$, and $V_Z$ are provided by a set of three output connections 84, 85, and 86. These connections provide inputs for an interface means 87, comprised of a high speed, three channel, analog to digital converter. (Many suitable replacements for interface 87 are available in the form of data acquisition cards or stand alone units that are readily available to anyone skilled in the art.) Interface 87 converts the $V_X$, $V_Y$, and $V_Z$ electrical signals into computer graphic control signals that are transmitted to a digital computer 88. A computer program 89 provides a system of controlling computer graphics, drawn by computer 88 in accordance with the $V_X$, $V_Y$, and $V_Z$ signals, and displayed on a computer display 90.

Operation of the Invention

Figure 4:
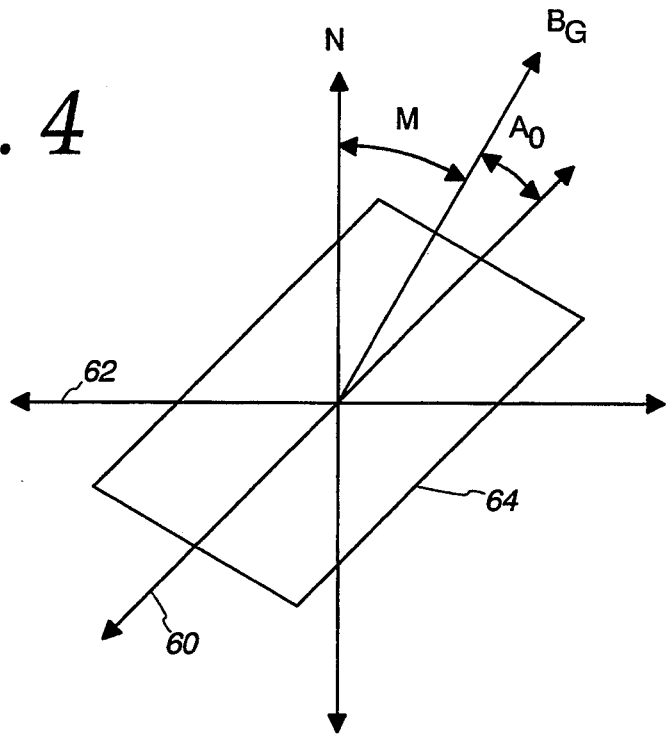
FIG. 4 is an illustration of one sensor plane showing two axes of rotation, a line defining 180 degrees of rotation, and a ray describing the direction of the geomagnetic flux.

Referring to FIG. 4, for rotations along two axes 60 and 62, and for a continuous range of angles there between, the amplifier output voltage from one sensor plane 64 varies in direct proportion to M, defined as an angle between the direction of a geomagnetic flux Bg and a line N that is perpendicular to the plane of the Hall sensor. The angle M is found by and equation, $M=KV_o$, equation 1, where Vo is the output of the amplifier in volts, and K is the sensitivity constant of the amplifier. K represents the relationship of volts per degree and is found by an equation, $K=180$ degrees/$V_{o max}-V_{o min}$, equation 2 of FIG. 5.

Figure 6:
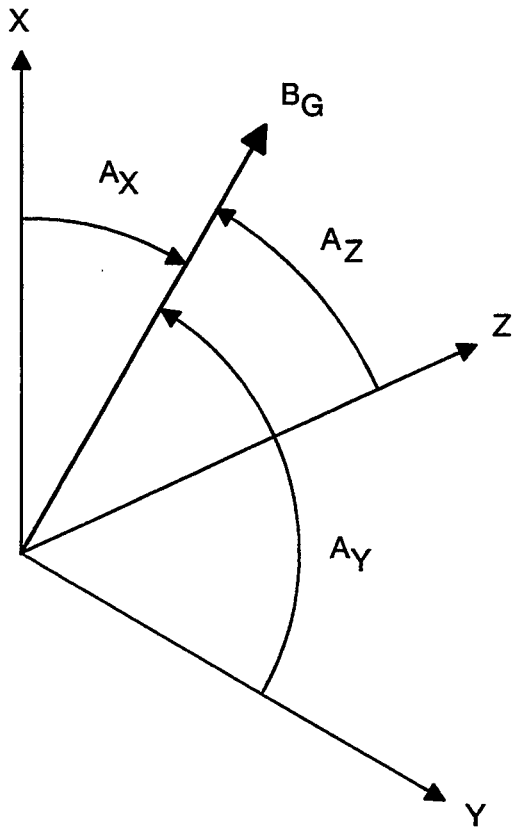
FIG. 6 is a mathematical representation of the respective angles between the geomagnetic flux and three orthogonal sensor planes.

Referring again to FIG. 4, because line N is perpendicular to sensor plane 64 the angle M and an angle $A_o$, between Bg and sensor plane 64, are complementary. It is known that the sum of two complementary angles is equal to 90 degrees. Therefore, the angle between Bg and sensor plane 64, angle $A_o$, may be found by subtracting the angle $M=Kvo$ from 90 degrees. Thus, it follows that for mutually orthogonal Hall sensor planes of FIG. 3, the direction of the geomagnetic flux may be found by the following relations: Eq. 3, $A_X=90-KV_X$ degrees; Eq. 4, $A_Y=90-KV_Y$ degrees; Eq. 5, $A_Z=90-KV_Z$ degrees; where $A_X$, $A_Y$, and $A_Z$ are the respective angles between Bg and the X, Y, and Z sensor planes (see FIG. 6).

Although useful as a mathematical proof for the operability of the present invention, the aforementioned method of determining the orientation of the geomagnetic sensor does not conform to the primary objective of usefulness as a computer input device. Referring to FIG. 8, the preferred use of the geomagnetic orientation sensor involves a method for controlling computer graphics. This method includes interface means 87 for connecting geomagnetic orientation sensor 80 to computer 88 and a system, embodied as computer program 89 for converting the 180 degree maximum angular displacement values of the sensor to computer angle values with a maximum of 360 degrees. The resulting pitch, roll, and yaw numbers as determined by program 89 represent the angular displacement of the X, Y, and Z sensor planes with respect to the geomagnetic flux 1.

Figure 7:
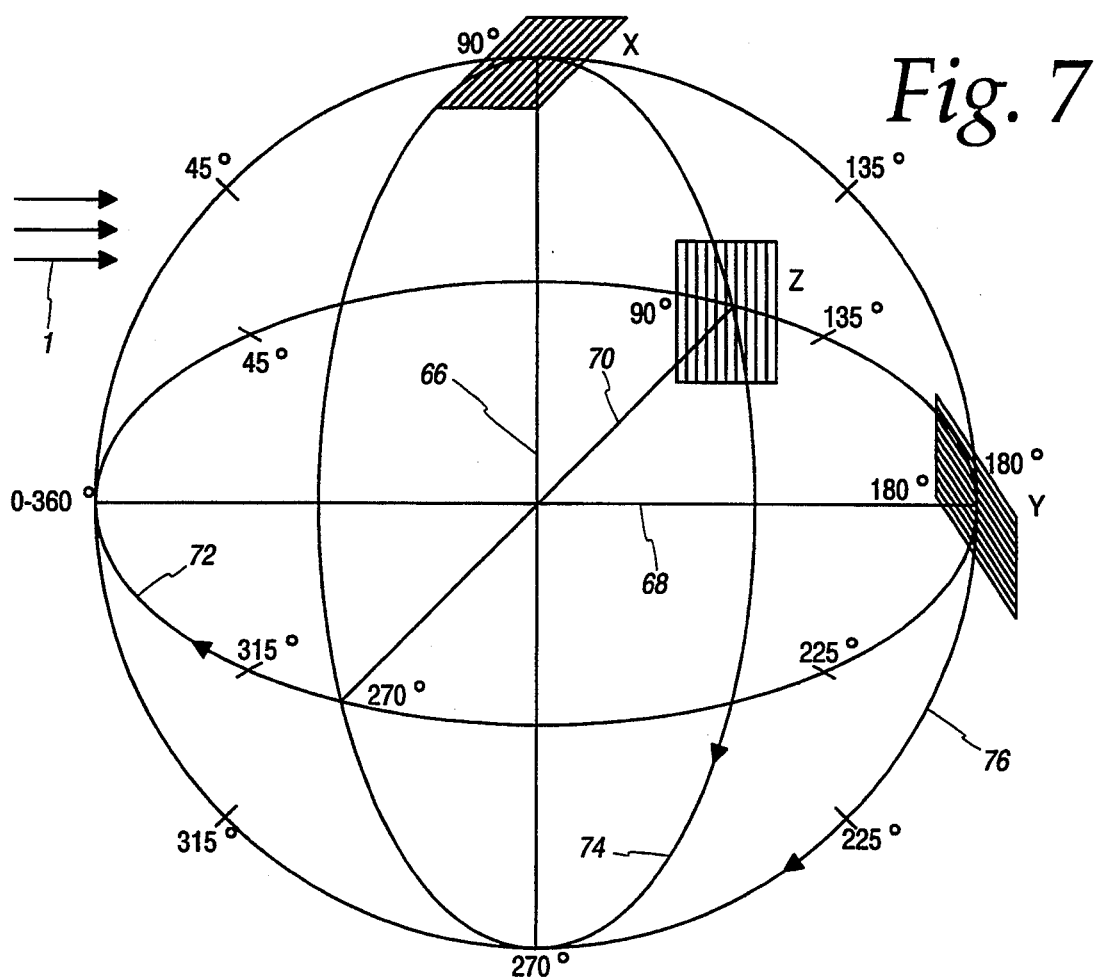
FIG. 7 is a perspective model of three orthogonal Hall sensor planes showing three axes of rotation, circular paths of rotation and a visual representation of the geomagnetic flux lines.

The system embodied by computer program 89 is derived from an illustrative representation of three orthogonal Hall Planes shown in FIG. 7. This representation shows three axes of rotation 66, 68, and 70, circular paths of rotation 72, 74, and 76, three orthogonal planes, an X plane, a Y plane, a Z plane, and geomagnetic flux 1.

From Eq. 1, $M=Kvo$, we get: Eq. 6, $X_1=KV_X$; Eq. 7, $Y_1=KV_Y$; and Eq. 8, $Z_1=KV_Z$, where $X_1$, $Y_1$ and $Z_1$, are the 180 degree maximum angle measures of planes X, Y, Z, K represents the sensitivity constant, Eq. 2, and $V_X$, $V_Y$, and $V_Z$, are the output voltages of the three differential amplifiers (FIG. 8).

Referring again to FIG. 7, plane Y is shown at 180 degrees of angular displacement with respect to geomagnetic flux 1. Because the three planes are mutually orthogonal, plane X and plane Z are at 90 degrees of angular displacement with respect to geomagnetic flux 1. Thus it follows that for plane Y to further rotate around rotational path 72, plane Z must rotate to an angle greater than 90 degrees. The same is true for plane X, if plane Y rotates greater than 180 degrees along rotation path 76. Furthermore, it is seen that if the sum of any two of the X1, Y1, Z1 angular displacement values is greater than 180 degrees, the remaining X1, Y1, Z1 angular displacement must be greater than 180 degrees and equal to 360 degrees minus itself.

This system of expanding the 180 degree semi-sphere of orientation values into 360 degrees of pitch, roll, and yaw values is defined by a group of six logic statements represented by a computer program, as follows: IF $Y1+Z1 \geq 180$, THEN $X2=360-X1$; IF $Y1+Z1<180$, THEN $X2=X1$; IF $X1+Z1 \geq 180$, THEN $Y2=360-Y1$; IF $X1+Z1<180$, THEN $Y2=Y1$; IF $X1+Y1 \geq 180$, THEN $Z2=360-Z1$; IF $X1+Y1<180$, THEN $Z2=Z1$. The resulting pitch, roll, and yaw values X2, Y2, and Z2, in conjunction with a wide variety of computer programs not shown, allow the computer to alter graphics on a computer display (90 of FIG. 8).

Conclusions, Ramifications, and Scope of the Invention

It may be seen that specific rotations of the geomagnetic orientation sensor can be made such that the angles between the geomagnetic flux and each of the sensor planes do not change. However, these perfect motions are a very small fraction of the entire sphere of operation, and are very difficult to achieve. For example, the sensor works very well when attached to a user's hand, but may not work at all if he happens to be standing at the North pole.

Furthermore, the reader will find that the orientation sensor representing the present embodiment provides a small, affordable, and reliable device that is particularly well suited for use in close proximity to magnetically sensitive devices such as televisions and micro computers. Also, as with any orientation sensor apparatus, there is a wide number of alternative embodiments that are useful for, among other things, robotics, automatic leveling equipment, and communication and mobility aid for physically disabled persons.

The above description contains many specific attributes; however, these should be considered as exemplifications of one preferred embodiment, rather than limitations on the scope of the invention. Many variations are possible. For instance, the sensitivity could be increased by adding more Hall elements to each of the sensor planes. The reliability of the sensor could be strengthened by using newer, better electronic components such as a new type of thermistor for improved temperature stability. Or, specific parts of the invention could be rearranged to achieve the same effect. For example, three orthogonal pairs of Hall effect generators could be made so, by placing each of six Hall elements on the six sides of a cube. Accordingly, the invention's scope should not be determined by the embodiments illustrated, but by the appended claims and their legal equivalents.

We claim:

1. A geomagnetic orientation sensor apparatus for generating three sets of voltage differentials representing the angular displacement of the geomagnetic flux with respect to said sensor apparatus comprising:
   (a) a plurality of Hall voltage generating means arranged in three groups such that each of said groups is mutually orthogonal.
   (b) a set of electrical connections to each of said groups by which a plurality of opposing currents may flow in opposite directions through each of said groups.
   (c) electrical connections to each of said groups such that three sets of voltage differentials may be detected by an electronic amplifying means.

2. The geomagnetic orientation sensor of claim 1 wherein said Hall voltage generating means are made of semiconductive material.

3. The geomagnetic orientation sensor of claim 1 wherein said electronic amplifying means includes: three differential amplifiers; first of said differential amplifiers, connected to first of said groups; second of said differential amplifiers, connected to second of said groups; third of said differential amplifiers, connected to third of said groups.

4. The geomagnetic orientation sensor of claim 1 further including a protective enclosure.

5. The geomagnetic orientation sensor of claim 4 wherein said protective enclosure is rectangular shaped.

6. The geomagnetic orientation sensor of claim 5 wherein said protective enclosure is made of epoxy.

7. A computer input device comprising a geomagnetic orientation sensing means for generating three sets of orthogonal voltage differentials representative of the angular displacement of the geomagnetic flux with respect to said sensing means comprising:
   (a) a plurality of Hall voltage generating means arranged in three groups such that each of said groups is mutually orthogonal to the others.
   (b) a set of electrical connections to each of said groups such that a plurality of opposing currents may flow through each of said groups.
   (c) electrical connections to each of said groups such that three sets of voltage differentials may be detected by an electronic amplifying means.
   (d) an interfacing means of connecting said electronic amplifying means to a computer.

8. The computer input device of claim 7 wherein said interfacing means is a high speed analog to digital converter.

9. The computer input device of claim 7 wherein said electronic amplifying means includes: three differential amplifiers; first of said differential amplifiers connected to first of said groups; second of said differential amplifiers, connected to second of said groups; third of said differential amplifiers connected to third of said groups.

10. The computer input device of claim 7 wherein said Hall voltage generating means are made of semiconductive material.

11. The computer input device of claim 7 further including a protective enclosure.

12. The computer input device of claim 11 wherein said protective enclosure is rectangular shaped.

13. The computer input device of claim 12 wherein said protective enclosure is made of epoxy.

14. A computer input device for controlling graphics on a computer graphic display comprising:
   (a) a protective enclosure;
   (b) a geomagnetic orientation sensor means, within the enclosure, for sensing the magnitude and direction of angular displacement of the geomagnetic flux for a continuous range of angles with respect to three orthogonal planes passing therethrough and for generating electrical signals representative thereof, and including a plurality of Hall voltage generating means arranged in three groups such that each of said groups are mutually orthogonal, and a set of electrical connections to each of said groups by which a plurality of opposing currents may flow in opposite directions through each of said groups;
   (c) interface means, coupled to the sensor means, for translating said electrical signals into digital graphics control signals for transmission to a computer.

15. The computer input device of claim 14 wherein said Hall voltage generating means are made of semiconductive material.

* * * * *